United States Patent
Rowlands et al.

(10) Patent No.: US 7,663,961 B1
(45) Date of Patent: Feb. 16, 2010

(54) REDUCED-POWER MEMORY WITH PER-SECTOR POWER/GROUND CONTROL AND EARLY ADDRESS

(75) Inventors: Joseph B. Rowlands, Santa Clara, CA (US); Laurent R. Moll, San Jose, CA (US); John Gregory Favor, Scotts Valley, CA (US); Daniel Fung, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 476 days.

(21) Appl. No.: 11/740,901

(22) Filed: Apr. 26, 2007

Related U.S. Application Data

(60) Provisional application No. 60/746,049, filed on Apr. 30, 2006, provisional application No. 60/747,200, filed on May 14, 2006, provisional application No. 60/747,818, filed on May 22, 2006, provisional application No. 60/803,367, filed on May 28, 2006, provisional application No. 60/804,085, filed on Jun. 6, 2006.

(51) Int. Cl.
*G11C 5/14* (2006.01)
*G11C 8/00* (2006.01)

(52) U.S. Cl. .................. 365/227; 365/226; 365/230.03

(58) Field of Classification Search ............... 365/227
See application file for complete search history.

(56) References Cited

U.S. PATENT DOCUMENTS

| | | | | |
|---|---|---|---|---|
| 5,615,162 A | * | 3/1997 | Houston | 365/226 |
| 5,724,297 A | * | 3/1998 | Noda et al. | 365/226 |
| 7,352,236 B2 | * | 4/2008 | Mizuno | 327/544 |
| 7,360,023 B2 | * | 4/2008 | Goodrich | 711/128 |
| 7,457,917 B2 | * | 11/2008 | Damaraju et al. | 711/118 |
| 2004/0128445 A1 | * | 7/2004 | Israeli et al. | 711/129 |
| 2006/0044865 A1 | * | 3/2006 | Hirabayashi | 365/154 |
| 2006/0268648 A1 | * | 11/2006 | Dang et al. | 365/230.03 |

* cited by examiner

*Primary Examiner*—Son L Mai
(74) *Attorney, Agent, or Firm*—Osha • Liang LLP

(57) ABSTRACT

A reduced-power memory (such as for a cache memory system of a processor or a microprocessor) provides per-sector power/ground control and early address to advantageously reduce power consumption. Selective power control of sectors comprised in the reduced-power memory is responsive to a subset of address bits used to access the memory. The selective power control individually powers-up a selected one of the sectors in response to an access, and then powers-down the selected sector when the access is complete. The power-up is via an increase of differential between power and ground levels from a retention differential to an access differential. Time needed to vary the differential is masked by providing address information used by the selective power control in advance of providing other address information. For example, in a cache, a tag access is overlapped with power-up of a selected sector, thus masking latency of powering up the selected sector.

28 Claims, 8 Drawing Sheets

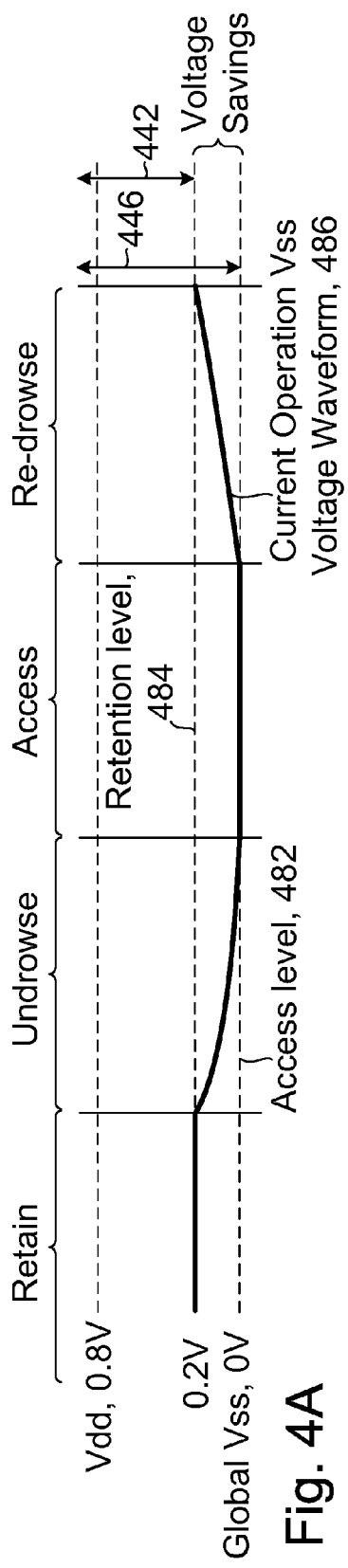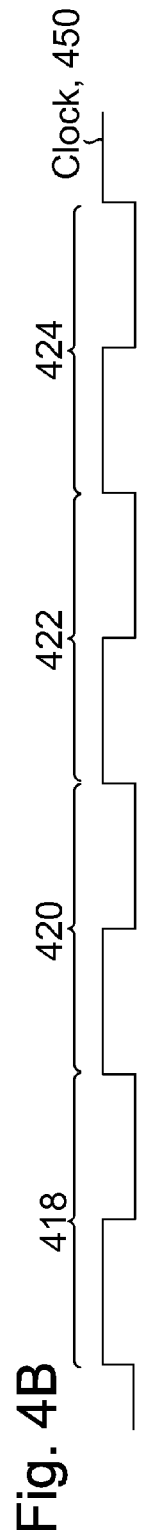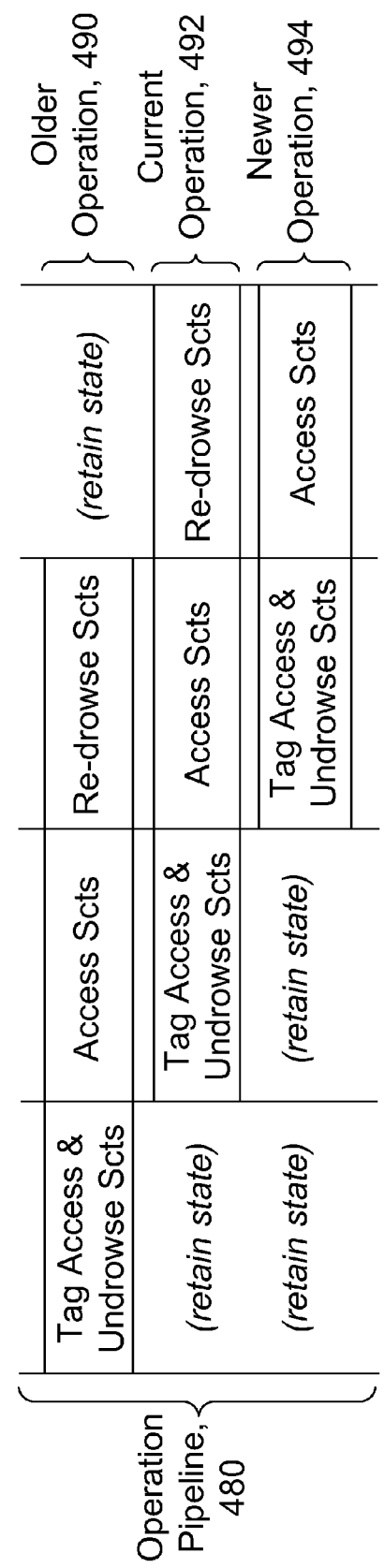

REDUCED-POWER MEMORY WITH PER-SECTOR POWER/GROUND CONTROL AND EARLY ADDRESS

CROSS REFERENCE TO RELATED APPLICATIONS

Priority benefit claims for this application are made in the accompanying Application Data Sheet (if any). To the extent permitted by the type of the instant application, this application incorporates by reference for all purposes the following application(s), which are all owned by the owner of the instant application:

- U.S. Provisional Application Ser. No. 60/746,049, filed Apr. 30, 2006, first named inventor Joseph B. Rowlands, and entitled REDUCED POWER CACHE MEMORY WITH PER-SECTOR POWER CONTROL;
- U.S. Provisional Application Ser. No. 60/747,200, filed May 14, 2006, first named inventor Joseph B. Rowlands, and entitled REDUCED POWER CACHE MEMORY WITH PER-SECTOR POWER CONTROL;
- U.S. Provisional Application Ser. No. 60/747,818, filed May 22, 2006, first named inventor Laurent R. Moll, and entitled RE-FETCHING CACHE MEMORY;
- U.S. Provisional Application Ser. No. 60/803,367, filed May 28, 2006, first named inventor Laurent R. Moll, and entitled RE-FETCHING CACHE MEMORY; and
- U.S. Provisional Application Ser. No. 60/804,085, filed Jun. 6, 2006, first named inventor Laurent R. Moll, and entitled APPLICATION-DIRECTED RANK COALESCING FOR MEMORY POWER MANAGEMENT.

This application is related to the following application(s) filed simultaneously herewith and which are all owned by the owner of the instant application, and to the extent permitted by the type of the instant application, this application incorporates by reference for all purposes the following application(s):

- U.S. Non-Provisional application Ser. No. 11/740,892 entitled REDUCED-POWER MEMORY WITH PER-SECTOR GROUND CONTROL.

BACKGROUND

Some processors, such as microprocessors, have memory arrays to store information (such as instruction and data caches). In some cases the memory arrays are volatile, as the memories are enabled to retain information only when at least some power is applied, that is, the memories lose the information without power. Retaining information in the memory arrays consumes power, even when the information is not accessed. The power consumed while retaining information arises, for example, from leakage currents associated with circuitry (such as transistors) in the memory arrays. In some memory arrays, accessing (such as reading or writing) the information consumes more power than retaining the information.

In some processors, power consumed by memory arrays is significant, leading to increased cooling costs, reduced battery life, and reduced reliability.

SUMMARY OF THE INVENTION

The invention, in response to significant power consumed by memory arrays, provides reduced-power memory with per-sector power/ground control and early address. In some embodiments, a volatile memory is implemented within one or more integrated circuits and comprises a plurality of sectors, each sector comprising one or more sub-sectors. A processor is further implemented within the integrated circuits. A method for reducing power consumption of the volatile memory comprises: receiving a first portion of an address within the volatile memory from the processor; in response to the first portion, powering-up a selected one of the sectors; after receiving the first portion, receiving a second portion of the volatile memory address from the processor; in response to the first and the second portions, selecting one of the sub-sectors from within the selected sector; and accessing at least a portion of the volatile memory within the selected sub-sector.

In some embodiments, a storage circuit adapted for use with a processor comprises an address interface circuit adapted to receive a first portion of an address and then to receive, a second portion of the address; a storage array circuit comprising a plurality of sectors, each sector comprising one or more sub-sectors, each sub-sector comprising a plurality of volatile data storage cell circuits, and each volatile data storage cell circuit being enabled to retain information when not powered-up and further enabled to provide access to the information when powered-up, and configured to consume less power when not-powered up than when powered-up; a power-sequencing circuit enabled to power-up a selected one of the sectors prior to an access as determined based at least in part on the first portion; and a sub-sector decoding circuit enabled to select one of the sub-sectors of the selected sector as determined based at least in part on the second portion. The storage circuit and the processor are implemented within one or more integrated circuits.

In some embodiments, a storage circuit adapted for use with a processor comprises means for receiving an address, the address comprised of first and second portions, the means for receiving enabled to receive the first portion before the second portion; means for volatile data storage arranged as sectors, each sector comprising one or more sub-sectors; means for powering-up a selected one of the sectors prior to an access as determined based at least in part on the first portion; and means for selecting one of the sub-sectors of the selected sector as determined based at least in part on the second portion. The power consumption of the selected sector is less when not powered-up than when powered up. The processor, the means for receiving, the means for volatile data storage, the means for powering-up, and the means for selecting are implemented within one or more integrated circuits.

In some embodiments, a medium readable by a computer system contains a description that generates, when processed by the computer system, a representation of a circuit comprising: an address reception control sub-circuit adapted to interface with a processor to control reception of a first portion of an address followed by a second portion of the address; a power-sequencing sub-circuit enabled to select one of a plurality of sectors of a storage array based at least in part on the first portion, and to direct powering-up of the selected sector prior to an access thereof; and a sub-sector decoding control sub-circuit enabled to direct operation of a sub-sector decoder circuit to select one of a plurality of sub-sectors of the selected sector as determined based at least in part on the second portion. The selected sector is configured to consume less power when not powered-up than when powered-up.

The invention is optionally embodied in various embodiments, including but not limited to one or more of a process, an article of manufacture, an apparatus, a system, a composition of matter, and a computer readable medium such as a computer readable storage medium or a computer network wherein program instructions, interpretable parameters, and hardware descriptions are sent over optical or electronic communication links.

DESCRIPTION OF THE FIGURES

FIGS. 4A-C illustrate an example of a sequential tag/data cache access pipeline timing diagram relating to an embodiment of a reduced-power cache memory, along with the voltage differential applied to a reduced-power portion of the cache memory.

DETAILED DESCRIPTION OF EMBODIMENTS OF THE INVENTION

Figure 1A:
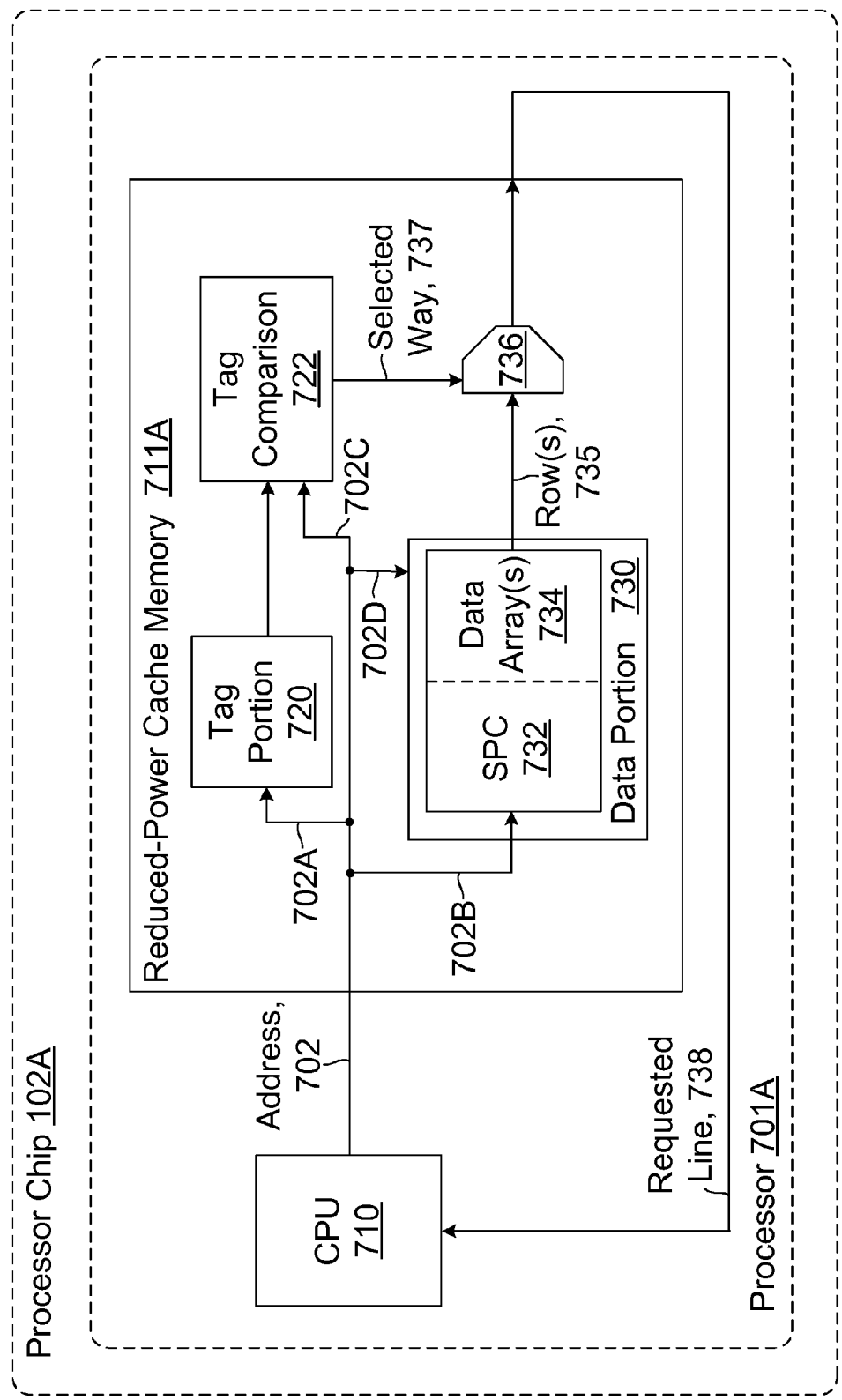
FIG. 1A illustrates selected details of an embodiment of the invention as a processor system incorporating a reduced-power cache memory having separate tag and data portions.

A detailed description of one or more embodiments of the invention is provided below along with accompanying figures illustrating selected details of the invention. The invention is described in connection with the embodiments. It is well established that it is neither necessary, practical, or possible to exhaustively describe every embodiment of the invention. Thus the embodiments herein are understood to be merely exemplary, the invention is expressly not limited to or by any or all of the embodiments herein, and the invention encompasses numerous alternatives, modifications and equivalents. To avoid monotony in the exposition, a variety of word labels (including but not limited to: first, last, certain, various, other, and some) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that, in accordance with a predetermined or a dynamically determined criterion, perform static and/or dynamic selection of one of a plurality of modes of operation corresponding respectively to a plurality of the multiple embodiments. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. As is described in more detail in the Conclusion section, the invention encompasses all possible modifications and variations within the scope of the issued claims.

Introduction

This introduction is included only to facilitate the more rapid understanding of the Detailed Description. The invention is not limited to the concepts described in the introduction, as the paragraphs of any introduction are necessarily an abridged view of the entire subject and are not meant to be an exhaustive or restrictive description. For example, the introduction that follows provides overview information limited by space and organization to only some embodiments. There are in fact many other embodiments, including those to which claims will ultimately be drawn, that are described throughout the balance of the specification.

Terms

Elsewhere herein various terms are used with respect to descriptions of embodiments. Examples of some of the terms follow.

An example of a "subset", with reference to a related collection of bits such as an address, refers to zero or more members of that collection, without specificity. For example, a subset of a collection of address bits refers to all of the address bits, or alternatively to any number of the address bits in the collection, not necessarily contiguous or in any defined order.

An example of a "storage array circuit" of a memory is a storage portion of the memory comprising an array of storage cells. In some embodiments, each of the storage cells holds one bit of data. In some embodiments, a storage array circuit is partitioned into a plurality of rows. In some embodiments, a storage array circuit is partitioned into a plurality of columns.

An example of a "row" of a memory is a number of storage cells of the memory sharing common control circuitry, such as a word-line driver and/or a word line. In various embodiments, each storage cell in a row is in a different bit position of the memory. In other embodiments, such as embodiments employing column MUXing, each group of n adjacent storage cells in a row is in a same bit position of the memory, and the groups are in different bit positions in the memory.

An example of a "column" of a memory is a number of storage cells of the memory sharing common control circuitry, such as a bit line and/or a bit-line receiver (such as a sense amp). In various embodiments, each storage cell in a column is in a same bit position of the memory. In further embodiments, such as embodiments employing column MUXing, a group of n adjacent columns is in a same bit position of the memory.

In some embodiments, a "sector" refers to a logical or physical portion of a memory, the sector being enabled for power control independently of other sectors. In various embodiments, a sector is a group of rows of the memory, and a sub-sector is a portion of a sector, such as one or more rows of a sector. In other embodiments, a sector is a group of columns of the memory, and a sub-sector is one or more columns of a sector. In some embodiments, a sector is a rectangular region of a memory comprising a portion of one or more rows and a portion of one or more columns, and a sub-sector is a portion of the sector comprising a sub-portion of the portion of one or more rows and a sub-portion of the portion of one or more columns.

In some embodiments, a sector comprises a plurality of storage cells of a memory. In some embodiments, the sector further comprises decoding circuitry or other logic of the memory. In further embodiments, the decoding circuitry is enabled to select a subset of the plurality of storage cells for access. For example, in various embodiments, a particular sector comprises a plurality of rows of a memory, and a word-line decoding circuit associated with the particular sector performs an address decoding function (operating on a portion of an address to the memory) to control and/or drive a number of word lines enabling access to individual rows.

In some embodiments, address decoding circuitry of a memory comprises a global decoding circuit, and, for each of a plurality of sectors of the memory, a per-sector word-line decoding circuit. The global decoding circuit is responsive to a first portion of an address provided to the memory, and selects and/or enables one or more of a plurality of sectors of the memory. The per-sector word-line decoding circuit associated with a particular sector is responsive to a second portion of an address provided to the memory, and selects and/or enables a subset of the storage cells of the sector. For example, in some embodiments, the per-sector word-line decoding circuit of a particular sector enables access to one of a plurality of rows of the particular sector. In some embodiments, the global decoding circuit provides power control for the sectors of the memory. In further embodiments, each sector comprises an associated one of the per-sector word-line decoding circuits, and the global decoding circuit provides power control for the per-sector word-line decoding circuits. In still further embodiments, power control for the per-sector word-line decoding circuit associated with a particular sector is separate from power control for the rows of the particular sector.

In some embodiments, "applying power" and "removing power", "power up" and "power down", "application of power" and "removal of power", as well as other similar terminology, refer to a change in the voltage differential applied to a circuit, such as a sector of a cache memory. In various embodiments, the application of power, also referred to as powering up, refers to an increase in the voltage differential or available current applied to a circuit. Similarly, in various embodiments, the removal of power, also referred to as powering down, refers to a decrease in the voltage differential or available current applied to the circuit. In some embodiments, and with respect to a sector of a cache memory, powering up and the consequent increase in effective supply voltage enables the sector to be accessed, such as for a read or a write operation. Powering down a sector of a cache memory reduces the effective supply voltage to the sector to a level where the sector is not accessible, but that is sufficient for the sector to retain state. Powering down, in various embodiments, is distinct from powering off, with the former referring to a reduced effective supply voltage level that is still sufficient to retain state, and the latter referring to an effective supply voltage level that is so low that, in some usage scenarios, state is lost.

In some embodiments, "volatile" distinguishes between memory enabled to retain information only when at least some power is applied (such as operating, accessing, or retention power), and memory enabled to retain information even when no power is applied. For example, conventional static and dynamic memories retain information when at least retention power is applied, and lose information when no power is applied. Thus the conventional static and dynamic memories are volatile. For a counter-example, conventional flash memories retain information even when no power is applied, and are thus non-volatile.

In some embodiments, a set-associative, multi-way cache comprises a plurality of independent ways (portions), wherein data at a given address is enabled to reside in any one of the ways. In various embodiments, each way has a tag portion and a data portion. In some embodiments, to look up an address to determine if it is resident in the cache, a first portion of the address is used as an index for all of the data portions in parallel. In further embodiments a second portion of the address is used as an index for all of the tag portions. In still further embodiments, a third portion of the address is compared with tag values read in parallel from the tag portions, and the results of the comparisons are used, at least in part, to select among data read in parallel from one or more of the data portions.

In some embodiments, a line is a unit of tagged data in a cache, and each line in the cache has an associated tag. The data resides in a data portion of the cache, and the tag resides in a tag portion. A value of a tag (also termed a tag value) in the tag portion is used, at least in part, to look up addresses and determine if a corresponding memory location is resident in the data portion of the cache.

In some embodiments, a memory is implemented as a multi-bank memory where the memory comprises multiple, at least partly independent banks that are separately addressable either for reading and/or for writing. In various embodiments, a multi-bank memory is enabled to perform more than one read and/or more than one write at a same time. In further embodiments, the multi-bank memory is enabled to perform, wholly or partially in parallel, fewer read and/or write operations than a number of banks due to limitations of control circuitry.

In some embodiments having a multi-bank memory, a row (or a column) of the memory is said to span multiple banks of the memory, such that for at least some accesses to the memory, a plurality of the banks are accessed in parallel to perform a single access. For example, each way of a multi-way, set-associative cache is a width of a cache line, and each way is also divided into a number of banks, one for each double-word in a cache line. The total number of banks is thus the number of ways times the number of double-words in a cache line. An access to the cache accesses a respective double-word in each way in parallel, and thus a row (in this example) of the cache effectively spans one bank in each way. In some embodiments, each bank has separate circuitry, such as a word-line decoding circuit. In some embodiments, power control for a sector containing the row is common across all of (and thus spans) the banks.

Overview

Power consumption of a memory array (such as an electronic memory device) is advantageously reduced by providing selective power control over portions of the electronic memory device, such as per-sector power and/or ground control. The electronic memory device, such as a Static Random-Access Memory (SRAM) or a Dynamic Random-Access Memory (DRAM), is controlled as a function of commands and addresses provided to the memory, leading to an overall power reduction in a system containing the electronic memory device. According to various embodiments, the electronic memory device defaults to being in a reduced-power state, is selectively powered to execute a particular command, and is then returned to the reduced-power state. In one embodiment, the electronic memory device is a cache memory for a processor, having a tag portion and a data portion. In further embodiments, the cache memory is set-associative and contains one or more ways. In response to a command, the tag portion is accessed and proximately in parallel one or more sectors of the data portion are selectively powered up, where a sector is a set of rows/columns in the data portion of the cache memory having individual power control. The powered-up sectors of the data portion are subsequently accessed, and when both the tag portion and the data portion accesses are complete, the tag access is used to validate and, for a set-associative, multi-way cache, to select a desired way from the results of accessing the data portion. The one or more sectors of the data portion are then returned to the reduced-power state. In some embodiments, the control over which sectors of the data portion are powered up is provided by a subset of the bits of an address portion of the command. In various embodiments, the subset of the address is provided earlier than a second portion of the address. In some embodiments, the cache is a set-associative, multi-way cache, and one or more sectors each containing one or more ways are powered-up in response to the command. In further embodiments, each sector contains lines from multiple ways of the cache.

Cache memories are used in processor systems to reduce latency associated with access to larger memories, such as DRAM, that are generally both slower to access and further from the processor. The power consumed by a cache memory, as with any RAM-based memory, is dividable into static power (consumed whether the memory is in use or not), and dynamic power (consumed only when the memory is used). The static power is of particular concern as shrinking geometries of transistors have greatly increased one component of the static power called the leakage power.

More recent techniques for power savings in RAMs attempt to save static power by putting some or all of the RAM into a "drowsy" mode where data is retained, but is not accessible. Some of the literature describes drowsy mode as a lowering of Vdd. For example, a RAM is normally operated at a Vdd of 1.0V, but in drowsy mode, Vdd is reduced to 0.75V, enough to retain data in the RAM, but not enough to access the RAM. Lowering Vdd, in some usage scenarios, greatly reduces the static power by decreasing the leakage power. Accessing the RAM, however, requires a latency penalty to power up the RAM and return Vdd to an access-enabling level. Furthermore, changing the voltage differential applied to the RAM, such as by raising Vdd to re-enable the RAM, consumes dynamic power. This implies that there are trade-offs between the dynamic power cost and the static power savings of such drowsy modes. Thus, the more of the RAM that is enabled to be drowsy, the greater the possible power consumption reduction.

There are previous academic descriptions of the use of drowsy mode with cache memories, however some of these attempts have not taken full advantage of three observations that enable more practical or more effective use of such systems. First, by designing a data portion of a cache so that groups of rows/columns in the data portion, called sectors, are enabled to be individually powered on, static power is saved (since only the required sectors need be fully powered on). Second, by using a sequential tag and data access, the required sectors in the data portion of the cache are powered on in parallel with the tag access, leading to a fixed and relatively low latency for the cache. A third observation is that the sectors in the data cache that need to be powered on are determined directly from the address, without waiting for the tag access. These observations, combined in some embodiments with other techniques, yield a system that is relatively straightforward to implement, and yet offers static power savings. In some implementations, the savings are quantifiable in that resultant systems offer both a deterministic latency for access, and a deterministic subset of the data portion of the cache that is active at any one time.

A sector-based RAM design groups a number of adjacent rows or columns of the RAM into a sector, a region with individual power control provided through controlling the voltage differential applied to the sector. According to various embodiments, a sector is a group of a relatively small number of rows (such as 4, 8, 16, or 32 rows) of the RAM. In some RAMs, area is saved by sharing Vdd and Vss lines between adjacent rows, whereby one row is mirrored compared to the next to facilitate the sharing. To implement sectoring, the sharing is broken at sector boundaries, providing for isolation of power according to the sector boundaries. Hence, sectoring implies a small area penalty, since there must be one additional Vdd and Vss line per sector. Thus there is a trade-off between the area cost of sectoring, and the power savings possible through using sectoring. More rows per sector will have a lower area overhead, but will also have a smaller possible power savings.

With sectoring, each sector has an individually controllable Vdd and/or Vss. A sector is placed into a drowsy mode (where data is retained but not accessible), or powered-down, by either lowering Vdd or by raising Vss. In some embodiments, Vss is raised, while in other embodiments Vdd is lowered. In still other embodiments, Vss is raised and Vdd is lowered. Consider an example low-power system where Vdd is nominally 0.8V and Vss is nominally 0V. When put into drowsy mode, a sector Vss is raised to 0.2V. The value used depends in part on the process and the voltage differential required to maintain state in the RAM. In some embodiments, the Vss voltage level is dynamically adjusted based on factors such as temperature that in some usage scenarios also affects data retention. It is also contemplated that the voltage differential needed for operating the RAM is, in some embodiments, different based on a command given to the RAM. For example, a read command, that transfers out the contents of a row non-destructively, uses a larger operational voltage differential than a write command that over-writes the contents of one or more cells.

In some embodiments sectoring is limited to power-controlled rows/columns of a data portion. In some embodiments, the word line drivers associated with the rows/columns in a sector are also power-controlled along with the data portion of the associated sector. In some embodiments having power-controlled word line drivers, a word line address decoding circuit is split into a global decoding circuit that is enabled whenever the RAM is enabled, and, for each sector, a per-sector word-line decoding circuit that is enabled only when the associated sector is enabled. For example, the word line decoding circuit comprises a global portion that selects one of several sectors, and a per-sector portion associated with, and power-controlled with, each sector. The per-sector portion is used to select a single row from the corresponding sector, such as by driving one of one or more word lines of the sector. While the rows of the sector have a minimum required voltage differential for data retention, the per-sector portion of the word line address decoding circuit has no state, and the decoding circuitry (supply) voltage differential is, in some embodiments, controlled independently from that of the data rows. According to various embodiments, any combination of timing of the application or removal of power, and variation in voltage differential required for operational or inactive status are employed.

In some embodiments sectoring is combined with traditional dynamic power-saving techniques. For example, a power-reduced RAM using sectoring includes a global enable to gate off clocks and stop logic transitions, thus saving dynamic power. In some embodiments, the global enable has lower latency than that required by sectoring, since the global enable does not affect the voltage differential, but only whether portions of the circuit are allowed to change state.

Some RAMs employ column multiplexing, a technique whereby adjacent bits in a single row correspond to different words in the RAM. Column multiplexing thus interleaves data from different words within one row, and is advantageous for reliability and other reasons. In a RAM with 4-to-1 column multiplexing, for example, a sector with n rows holds 4*n words. In some embodiments, the addressing of the data portion of a set-associative, multi-way cache is arranged to preferentially take advantage of column multiplexing by using the multiple words within one row as lines from different ways in the set-associative cache. Thus, when one sector is powered-on and a single row is accessed, the data for multiple ways is available in parallel.

In some embodiments, power reduction via sectoring is combined with sequential tag and data accessing, enabling desired sectors of a data portion to be powered up proximately during the tag access, and the access to the data portion to begin as soon as a sufficient voltage differential is achieved for access. Thus the data access starts as soon as possible, and in some usage scenarios overlaps the tag access and comparison. When used with a set-associative, multi-way cache, the use of column multiplexing in the RAM (where the various columns in a row represent lines from different ways), a "late select" of a desired column based on the tag comparison is enabled, and, in some usage scenarios, further reduces latency.

Cache memories are either physically addressed, virtually addressed, or some combination thereof. In the most general construction, one subset of the address is used to address the tag portion of the cache memory, and a second and a third subset of the address are used to address the data portion. A fourth subset of the address is then used to compare with the results of the tag access both to determine whether the access hit (or missed) in the cache, and if a hit in a set-associative, multi-way cache, then which of the multiple ways is hit.

For set-associative, multi-way caches, the data retrieved, in some embodiments, represents multiple lines, and a selected way determined by the tag portion access and comparison is used to select the desired line. In a reduced-power cache memory, the second subset of the address is first used, at least in part, to control which sector or sectors of the data portion of the cache memory to power up, and then the second and third subsets of the address are used to select one or more lines from within the powered-up sectors. The results of the tag portion access and comparison are then used to validate the access to the data portion, and for a set-associative, multi-way cache, to select one of several lines retrieved by the data portion access.

According to various embodiments, there are several organizations of lines in reduced-power caches. For example, a set-associative, multi-way cache is enabled to benefit from column multiplexing by reading all columns in a powered-up sector in parallel, and by using the results of the tag portion access and comparison to choose one of the columns. If the number of ways exceeds the number of columns, then, in some embodiments, a multi-bank structure is used, where one sector from each bank is powered up, and all columns in all banks are read in parallel to access the required number of lines (one per way). In the multi-bank case, the set of sectors (one or more from each bank) that is powered-up and accessed in parallel is termed a sector group. In an alternate embodiment where latency is less critical but dynamic power is a concern, the data portion access is delayed until after the tag portion access and comparison has completed, and then only the necessary bank is enabled. In some usage scenarios the delayed data access embodiment saves additional static power by only applying power to the desired sector.

In some embodiments, a lower level (such as a first level, or L1 cache) of a multi-level cache hierarchy is implemented with one or more reduced-power cache memories. In some embodiments, a higher level (such as a second level or L2 cache, or a third level or L3 cache) of a multi-level cache hierarchy is implemented with one or more reduced-power cache memories. In some embodiments, various combinations of lower and higher level caches are implemented with one or more reduced-power cache memories. In some embodiments, caches subject to access filtering (such as higher level caches) are implemented as reduced-power caches.

In some embodiments, the dynamic power consumed when sectors are powered on and off is reduced by taking advantage of cases where sequential accesses occur within the same sector. For the sequential accesses the sector is not powered down. In some embodiments (depending, for example, on frequency of access and degree of locality of references expected) a sector is left powered on for some number of cycles (once it is powered on), under the assumption that it may be used again shortly. In other embodiments, instead of relying on a fixed time to power up a sector, a voltage detector is used to determine when a sector has sufficient voltage differential to be accessible. Thus a powered down sector may be powered up faster when not fully discharged.

In some embodiments, it is advantageous to further sequence the operations of the cache memory for additional power-savings. For example, if the cache memory is a level-two or a level-three cache that is not accessed 100% of the time, in some usage scenarios it is advantageous to use dynamic power-saving techniques to disable some or all of the cache memory. If the cache memory is not accessed every cycle, then in some usage scenarios it is advantageous to use the static power saving techniques described herein on the tag portion of the cache memory, saving static power at the possible cost of a start-up penalty to access even the tag portion. In some embodiments, further power is saved by powering off non-state-holding portions of the cache memory, such as the row decoders, and only powering the powered-off portions when an access is required. In some embodiments, power to various portions of the RAM, such as the row decoders and the desired sectors, is sequenced to maximize power savings. In some embodiments, the row decoders require less time to return from a powered-off state to an operational state than the sectors require to transition from a powered-down state to a powered-up state enabled for access. Power is saved by delaying the application of power to the row decoders so that the row decoders and the sectors attain operational power levels at approximately the same time.

Sectoring is not limited to use in a cache memory, but is applicable to any random access memory, such as applications where latency to power up a desired sector of the random access memory is not the overriding concern, or where the power-up latency is hidden. In particular, in some applications a portion of the address bits are available at an earlier time than others, similar to the how the cache memory application has the address available earlier than the selected way. By choosing the address bits that are available earlier to enable and control the power-sequencing, the techniques described herein are used to reduce the overall power consumption.

In some embodiments, a reduced-power memory is comprised in a re-fetching memory and/or cache. Re-fetching memory and/or cache techniques are described in U.S. Provisional Application Ser. No. 60/747,818, filed May 22, 2006, first named inventor Laurent R. Moll, and entitled RE-FETCHING CACHE MEMORY; and U.S. Provisional Application Ser. No. 60/803,367, filed May 28, 2006, first named inventor Laurent R. Moll, and entitled RE-FETCHING CACHE MEMORY, which are all owned by the owner of the instant application and incorporated herein by reference for all purposes.

System

Figure 1B:
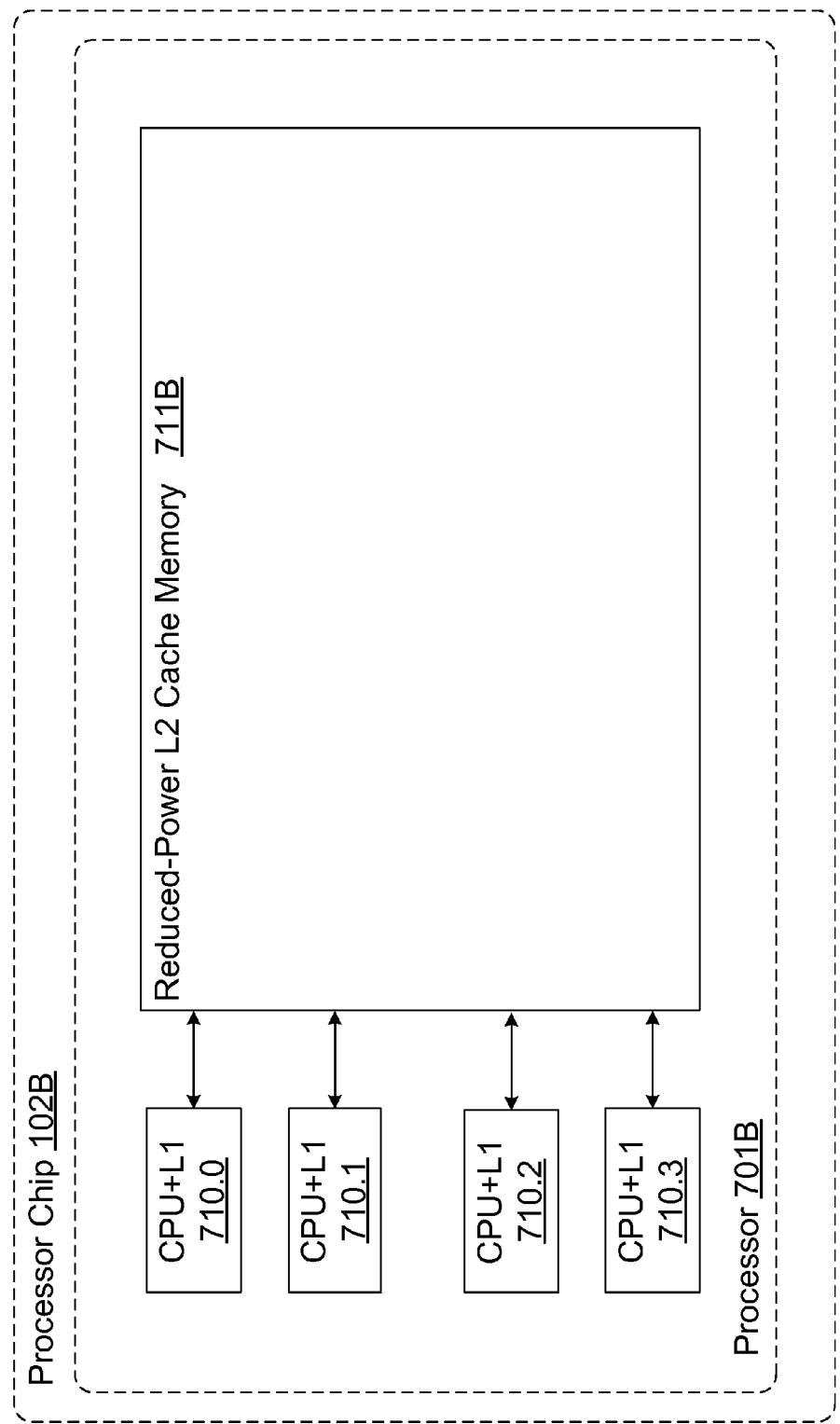
FIG. 1B illustrates selected details of an embodiment of the invention as a multi-core processor system incorporating a reduced-power cache memory.
Figure 1C:
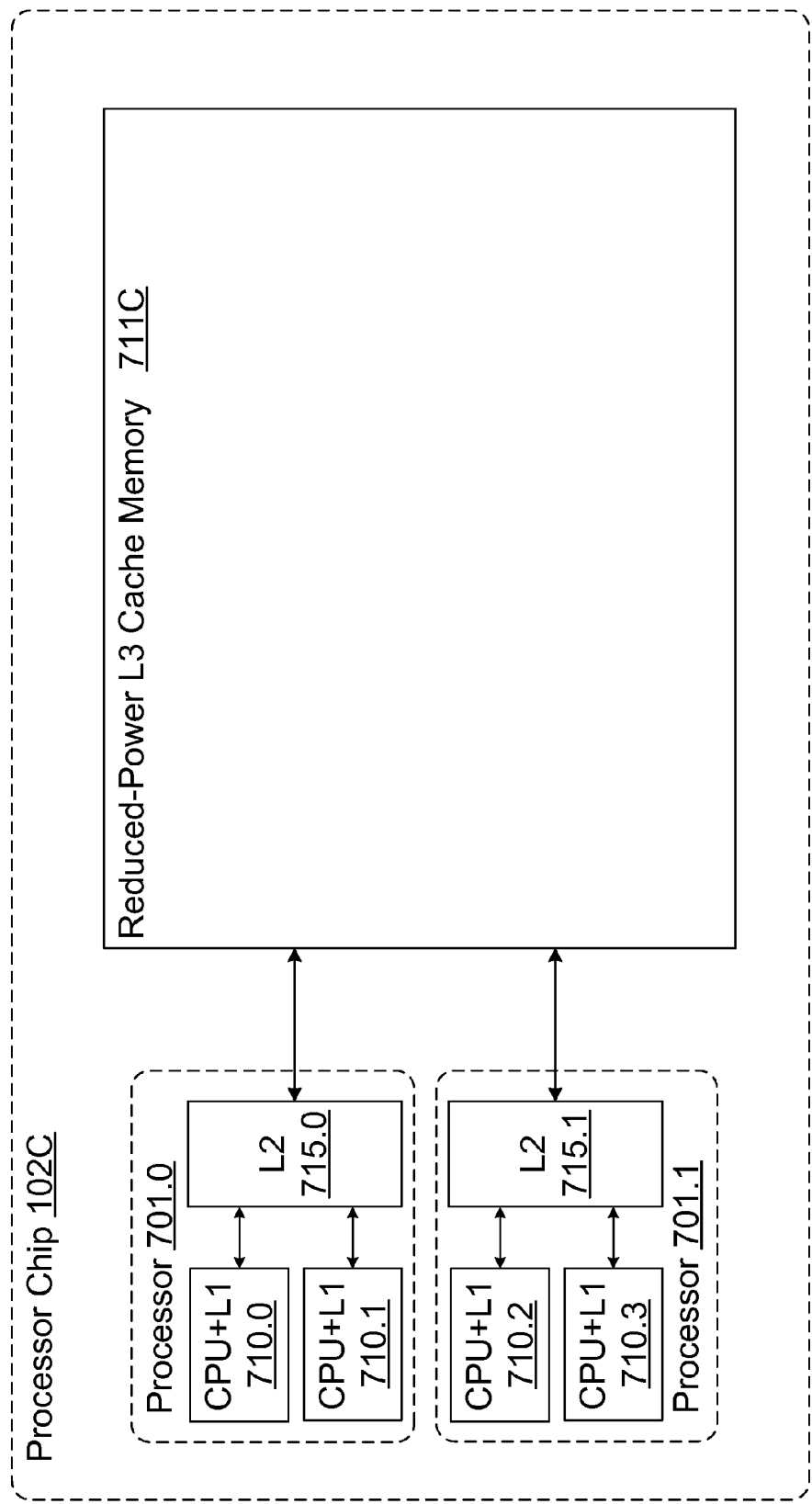
FIG. 1C illustrates selected details of an embodiment of the invention as a multi-core processor system incorporating a reduced-power cache memory as the highest level of a multi-level cache memory.

FIG. 1A illustrates selected details of an embodiment of the invention as a processor system incorporating a reduced-power cache memory having separate tag and data portions. The figure illustrate processor chip 102A incorporating Central Processing Unit (CPU) 710 and reduced-power cache memory 711A. FIGS. 1B to 1C illustrate multi-core processor chip embodiment having one or more CPUs with associated L1 caches (as CPU+L1 elements 710.0-3) along with a reduced-power cache memory (reduced-power L2 cache memory 711B of FIG. 1B and reduced-power L3 cache memory 711C of FIG. 1C). In FIG. 1C, the CPUs are part of one or more processors 701.0-1. In various embodiments, CPU 710 of FIG. 1A (and CPU+L1 elements 710.0-3 of FIGS. 1B and 1C) include one or more levels of caching, as indicated explicitly by "L1" to represent Level One caches of CPU+L1 elements 710.0-3. Processors 701.0-1 in FIG. 1C also include at least a second level of caching, illustrated respectively as L2 (Level Two) caches 715.0-1. FIGS. 1A to 1C all include a reduced-power cache memory external to the CPU (in FIG. 1A) or processors (in FIG. 1B and FIG. 1C), operating as a highest level of cache hierarchy. In some usage scenarios it is advantageous to use the power-reduction techniques described herein at the highest level of the cache hierarchy (due, for example) to the size and access rate of the highest-level cache. In other usage scenarios it is advantageous to employ the power-reduction techniques to any of the caches included in FIGS. 1A to 1C, such as either or both of L2 caches 715.0-1 in FIG. 1C. The choice of whether to use the power-reduction techniques described herein is based on factors such as, but not limited to: an area cost of using and controlling sectors; access rate of the cache; voltage at which the cache nominally operates; and manufacturing process type used to fabricate the cache memory.

FIG. 1A illustrates a high-level view of selected elements and couplings of reduced-power cache memory 711A. The figure highlights a read data path, including application of an address 702 to reduced-power cache memory 711A, and return of a requested line 738 from reduced-power cache memory 711A. A write data path for supplying write data to the reduced-power cache memory is omitted for clarity. Also omitted is a hit or miss indication produced by tag comparison logic 722. The reduced-power caches of FIGS. 1B and 1C (711B and 711C, respectively) are implemented using the techniques associated with FIG. 1A. In some embodiments, the reduced-power caches of FIGS. 1B and 1C vary in number, size, and organization compared to the reduced-power cache of FIG. 1A. In some embodiments, the reduced-power caches of FIGS. 1B and 1C include address, control, and data multiplexing circuitry used to interface with multiple, separate CPUs (such as CPU+L1 elements 710.0-1 of FIG. 1B) or processors (such as processors 701.0-1 of FIG. 1C) accessing the reduced-power cache memory. In some embodiments, the multiplexing circuitry is separate from the reduced-power caches.

As illustrated in FIG. 1A, reduced-power cache memory 711 is a set-associative, multi-way cache memory and includes tag portion 720, tag comparison logic 722, data portion 730, and line-select MUX 736. Tag portion 720 is a random-access memory responsive to a first subset of address 702, illustrated as 702A. Results of an access of tag portion 720 are compared against a third subset of address 702, illustrated as 702C, by tag comparison logic 722 to produce selected way 737. Proximately in parallel with the access of the tag portion, a second subset of address 702, illustrated as 702B, is used to first selectively power-up and subsequently to access data portion 730. Second subset of the address 702B applied to data portion 730 is decoded by Sector Power Control (SPC) 732 to enable power-sequencing for one or more desired sectors of data array(s) 734. When the effective supply voltage applied to the one or more desired sectors of data array(s) 734 is at a sufficient level to permit access, further decoding of second subset of the address 702B, possibly combined with a fourth subset of address 702, illustrated as 702D, is used to access one or more desired rows of data 735. In some usage scenarios, each data array produces one row, and each row contains one or more cache lines. The one or more desired rows of data 735 thus contain one or more cache lines. Line-select MUX 736, under control of selected way 737, selects one of the cache lines to be returned as requested line 738. In some embodiments, depending upon the number of ways in the cache and the degree of column multiplexing in data arrays 734, one or more address bits of address 702 are also be used to control line-select MUX 736. For example, if the product of the column multiplexing factor and the number of data array(s) 734 exceeds the number of ways, then the lines included in the desired rows of data 735 is further selected through the use of one or more address bits to produce a single line of data on requested line 738.

While the above description has covered the more complex case of a set-associative, multi-way cache memory, the simpler case of a non-set-associative (a single way) cache memory is a degenerate case having no selected way 737 and line-select MUX 736 operates as a pass-through or is replaced by an equivalent coupling.

Figure 1D:
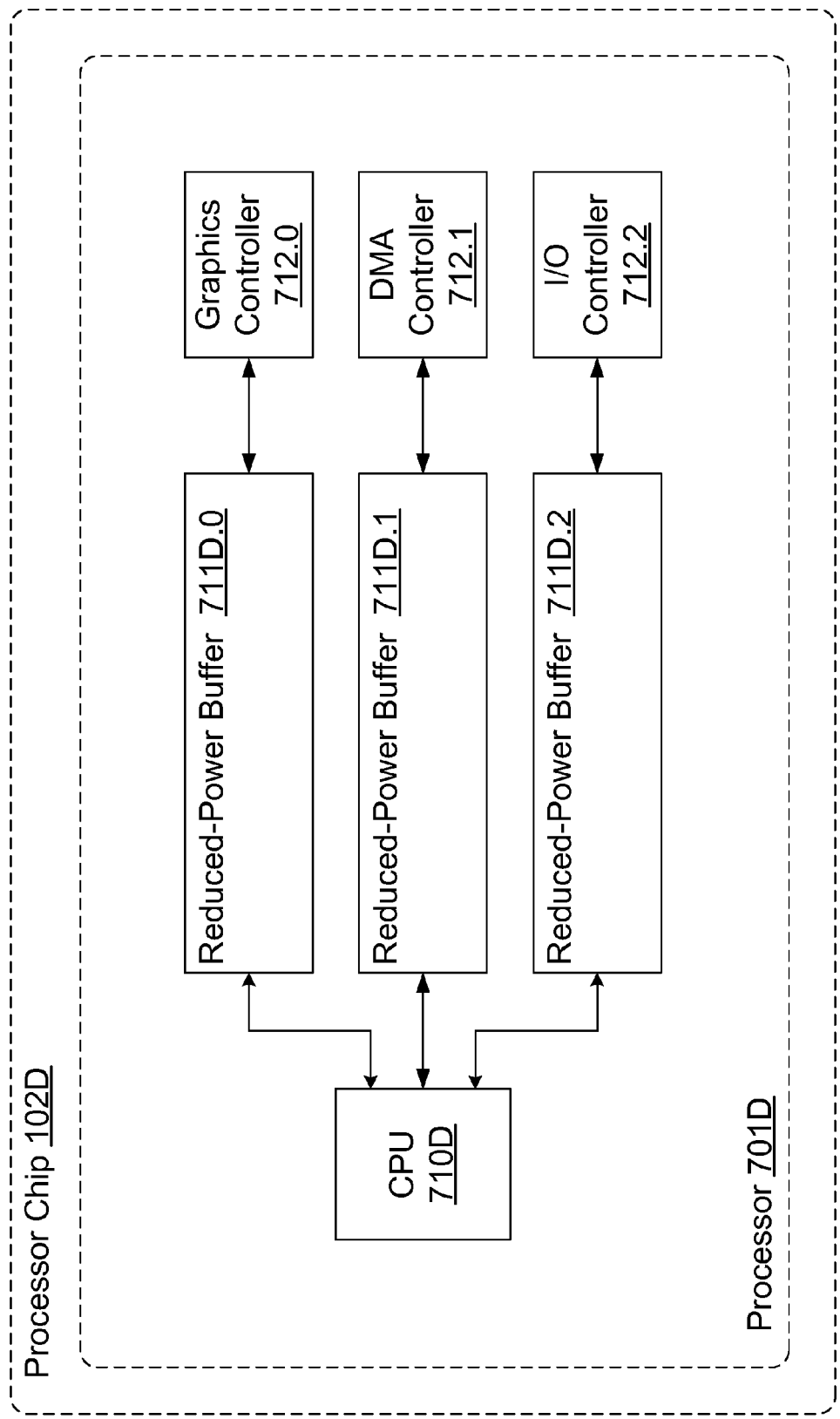
FIG. 1D illustrates selected details of an embodiment of the invention as a system incorporating a reduced-power buffer coupled to a processor and to a controller.

FIG. 1D illustrates selected details of an embodiment of the invention as a system incorporating a reduced-power buffer coupled to a processor and to a controller. As illustrated in FIG. 1D, processor 710D is coupled to reduced power buffer memories (buffers) 711D.0, 711D.1, and 711D.2. Each of the reduced power buffers is additionally coupled to a respective controller: graphics controller 712.0, DMA controller 712.1, and I/O controller 712.2. According to various embodiments, zero or more of reduced power buffers 711D.0, 711D.1, and 711D.2 and the respective controllers are present. In some embodiments, one or more of the reduced power buffers comprise at least a portion of a cache memory accessible by the processor. For example, the portion of the cache memory is, in some embodiments, a data portion. In some usage scenarios, the processor and the respective controller are enabled to access a particular one of the buffers at a same time. In other usage scenarios, solely one of the processor and the respective controller are enabled to access the buffer at a given time.

Reduced-Power Random-Access Memory (RAM)

Figure 2:
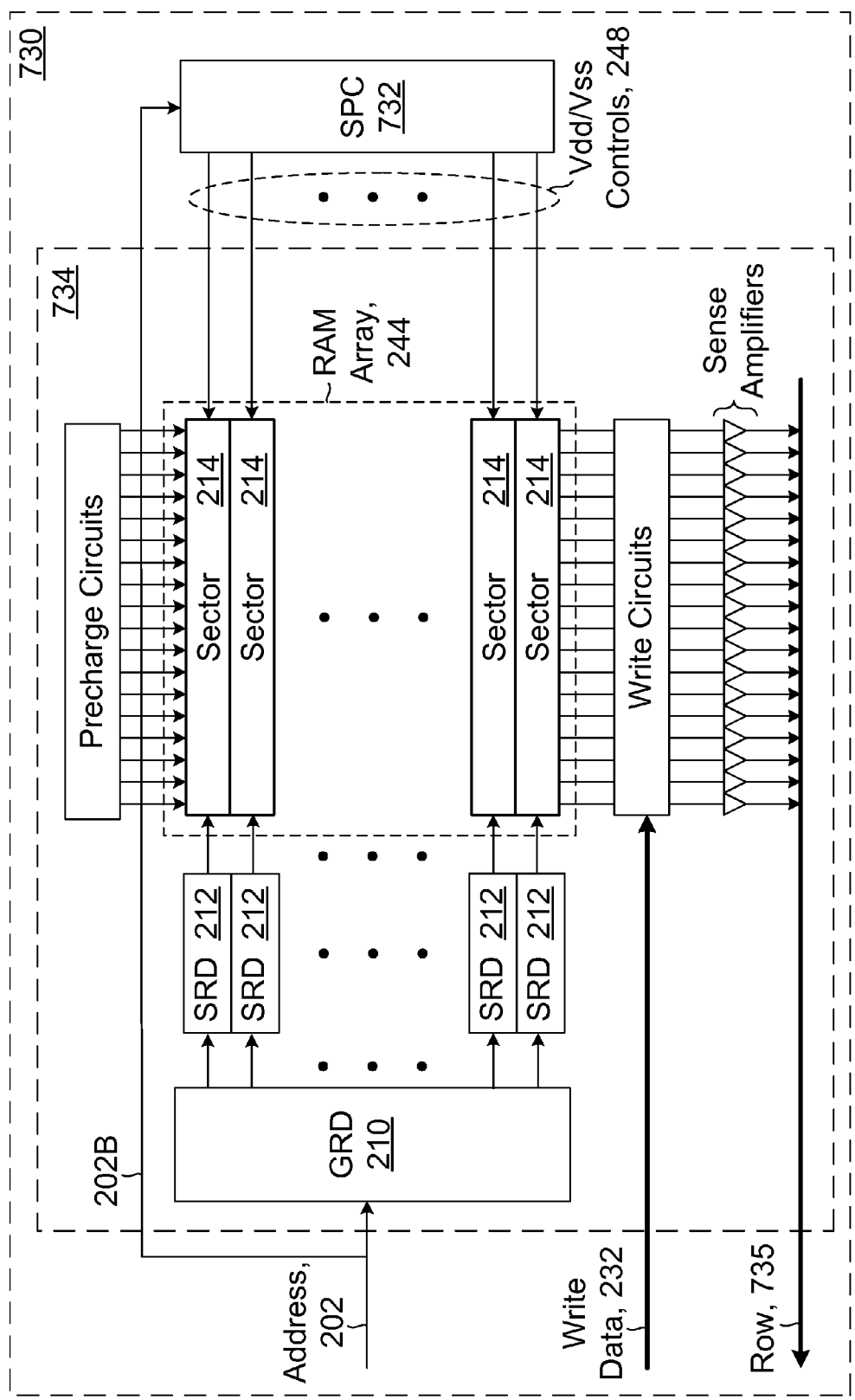
FIG. 2 illustrates selected details of an embodiment of the invention as a reduced-power Random-Access Memory (RAM) circuit embodiment incorporating individual power-controlled sectors.

FIG. 2 illustrates selected details of an embodiment of the invention as a reduced-power Random-Access Memory (RAM) circuit embodiment incorporating individual power-controlled sectors. In some embodiments, FIG. 2 corresponds to data portion 730 in FIG. 1A, though it only illustrates a single data array 734 with power controlled by SPC 732. In other embodiments, there are multiple copies of data array 734, all sharing a common SPC 732. In some usage scenarios, embodiments having a common sector power control are of particular use for a set-associative, multi-way cache memory with a large number of ways.

A subset of address 202, illustrated as 202B, is applied to SPC 732. SPC 732 provides voltage controls 248 to one or more sectors 214 of RAM array 244, via individual Vss and/or Vdd voltage controls per sector. In some usage scenarios, the RAM array has a power-of-two number of sectors, such as 2', and a subset of size n of the bits of address 202 are decoded to select one or more of the sectors to be powered for accessing. SPC 732 powers a sector, according to various embodiments, either by raising Vdd, by lowering Vss, or both, and in any case increasing the voltage differential between Vdd and Vss at the selected sector(s), raising the effective supply voltage. In some embodiments, SPC 732 gates one of two or more voltage levels onto a power rail, such as a Vss or a Vdd power rail, to increase or decrease the voltage differential. In some embodiments, the amount of voltage differential necessary to access the desired one of sectors 214 is a function of the command applied to the RAM. For example, a read command requires a larger voltage differential than a write command. In some embodiments, SPC 732 is a source of the Vss and/or Vdd voltages delivered to the sectors. In other embodiments, SPC 732 outputs voltage control signals 248 used to control the Vss and/or Vdd voltages delivered to the sectors through other circuitry.

Each of sectors 214 of RAM array 244 includes one or more rows (or alternatively columns, or further alternatively a portion of rows in conjunction with a portion of columns) of the RAM array. A row is generally understood to be a set of cells with a common word line that is used to enable the set of cells as a unit for reading and/or for writing. While SPC 732 ensures that the desired sectors (containing the desired rows) have a sufficient voltage differential for access, Global Row Decoding (GRD) 210 and Sector Row Decoding elements (SRDS) 212 are used to decode address 202 to select a single row for access. In some embodiments, GRD 210 and SRDs 212 are combined as one monolithic unit. In other embodiments, SRDs 212 are kept separate as illustrated, and are also power-controlled by SPC 732.

In some embodiments, each of SRDs 212 controls one or more logically adjacent rows (or alternatively columns), and in various embodiments the logically adjacent rows are physically adjacent or alternatively not physically adjacent. In some of the embodiments where the rows controlled by an SRD are not physically adjacent, the rows (or alternatively columns) controlled by the SRD are arranged in a regular fashion (e.g. "striped"), such as every $i^{th}$ row being controlled by one of i SRDs 212 (for example, every $16^{th}$ row is controlled by one of 16 SRDs). In other embodiments, each of SRDs 212 controls one or more physically adjacent rows (or alternatively columns). In various embodiments such as a set-associative multi-way cache, physical and/or logical adjacency of a group of rows (or columns) controlled by one of SRDs 212 is determined in part based on which of a number of ways of the multi-way cache the particular row (or column) is a member of.

Unlike sectors 214 of RAM array 244, the sector row decoding does not have state, and hence does not have the concept of a retention voltage, i.e. a minimum voltage necessary to hold state. Accordingly, in some embodiments, SPC 732 turns power entirely off to any of SRDs 212 coupled to sectors 214 not being accessed, and only turns power on to elements of SRDs 212 coupled to sectors 214 that are being accessed. In some circumstances, selectively powering off row decoding logic elements prevents or reduces spurious logic transitions and saves power, since in some usage scenarios a common subset of address 202 is applied to all of SRDs 212, yet only one or a small number of them are in use at a given time. In an alternate embodiment, for simplicity of power distribution, SRDs 212 share Vdd and Vss connections with corresponding sectors 214.

In some embodiments, SPC 732 operates in one or more stages. For example, if SRDs 212 are power-controlled, then a desired one of SRDs 212 is powered on either before or after the power on of a corresponding sector 214. In some usage scenarios, the most efficient sequencing order depends on the time for the relevant elements of SRDs 212 and sector 214 to each achieve a voltage level sufficient to support the required access.

In some embodiments, SPC 732 applies power to more than one sector at a time. In particular, pipelined access to the data array 734 enables a series of accesses to operate in parallel, each time-shifted by, for example, one clock cycle from the previous access. A first access is decoded by SPC 732 while an earlier access is accessing a desired sector 214 of RAM array 244. The degree of pipelining varies based on implementation requirements and on how fine a time granularity individual steps require. For example, in some situations, several clock cycles transpire from the application of power to a desired one of sectors 214 until an access to the sector is possible. During the time the desired sector is being powered up, prior accesses referring to other (powered up) sectors may be in progress.

In some embodiments, each of sectors 214 have storage for status information associated with data of the sector (such as flushed, invalid, and various cache line state information). In some embodiments, power is not applied to sectors that lack useful data (such as a sector having only flushed or only invalid cache lines).

Reduced-Power Set-Associative Embodiments

Figure 3:
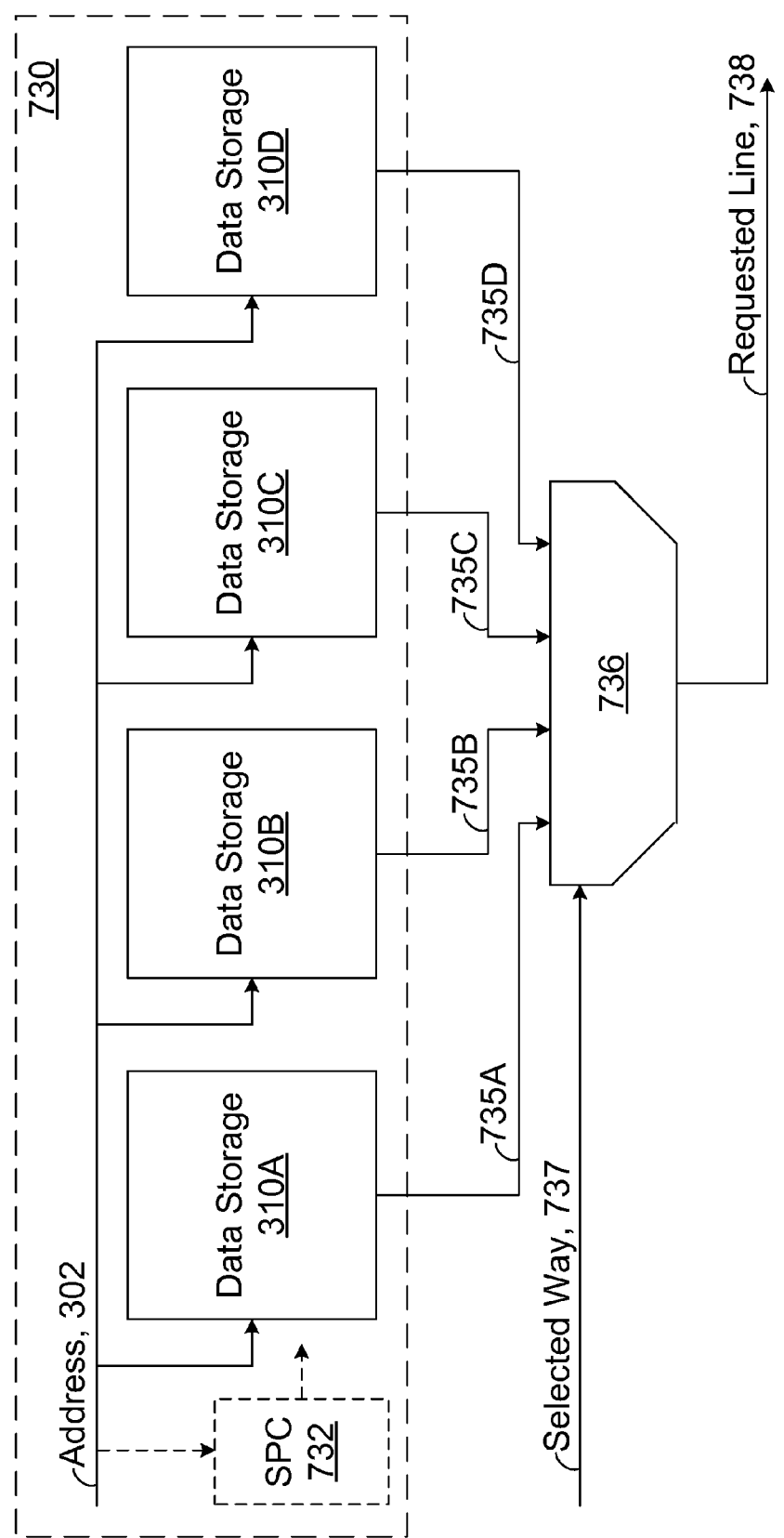
FIG. 3 illustrates selected details of an embodiment of the invention as a data portion of a set-associative, multi-way cache incorporating sector groups for power reduction.

FIG. 3 illustrates selected details of an embodiment of the invention as a data portion of a set-associative, multi-way cache incorporating sector groups for power reduction. In one embodiment, each of data storage units 310A-D corresponds to a reduced-power, random-access memory as in FIG. 2, including a respective instance of data array 734 and a respective instance of SPC 732. Thus data storage units 310A-D considered as a unit represent data portion 730 as in FIG. 1A. In an alternate embodiment, each of data storage units 310A-D corresponds to a respective instance of data array 734, and one or more instances of SPC 732 are shared among the data storage units 310A-D. Thus data storage units 310A-D combined with the shared sector power controls (illustrated by SPC 732 in dashed-outline of FIG. 3) represent data portion 730.

The term sector group, used with respect to FIG. 3 and associated embodiments, indicates that the power sequencing logic is used to control one or more sectors in each of the data storage units 310A-D. The term sector group refers to a related set of sectors, one or more from each of the data storage units, that are powered up in unison and accessed in parallel. The term sector group is used to indicate that sectors from different instances of data arrays (such as instances of data array 734) are configured to power up (and down) together.

Address 302 in FIG. 3 is analogous to address subsets 702B and 702D in FIG. 1A coupled to data portion 730. In response to address 302 each data storage unit 310A to 310D produces a respective row of data 735A to 735D. The rows of data 735A-D (each or collectively) contain one or more cache lines, depending on the column multiplexing factor in the data array inside the data storage unit 310. In some usage scenarios, all of the data arrays in the storage units employ the same column multiplexing factor. In some embodiments, a row of data is only a fraction of a cache line, and multiple accesses to data storage units 310 produce a full cache line.

Selected way 737 (as produced from the results of a tag comparison, such as by tag comparison logic 722 in FIG. 1A) is used to control line-select MUX 736 and to select one of the lines among the one or more lines in each of rows 735A to 735D. In some embodiments where there are fewer ways than the product of the column multiplexing factor and the number of data storage units, the selected way is augmented by one or more of the bits of the address to select a single line from among the one or more lines.

Reduced-Power RAM Sequencing

FIGS. 4A-C illustrate an example of a sequential tag/data cache access pipeline timing diagram relating to an embodiment of a reduced-power cache memory, along with Vss voltage waveform 486 applied to one or more sectors in a reduced-power portion of the cache memory in response to a current operation 492. FIG. 4B illustrates a clock 450, and four sequential clock cycles 418, 420, 422, and 424 of the clock. FIG. 4C illustrates pipelining of three operations as operation pipeline 480, with older operation 490, current operation 492, and newer operation 494, with respect to clock 450. In a similar fashion, FIG. 4A illustrates Vss voltage waveform 486 for current operation 490, also with respect to clock 450.

The right side of FIG. 4A illustrates one manner that the voltage differential (or effective supply voltage) applied to the data array of a Random-Access Memory is varied between a higher voltage differential suitable for accessing the memory, and a lower voltage differential suitable for retaining data in the memory. An access voltage differential 446 of 0.8V between Vss and Vdd is illustrated by Vdd at a 0.8V relative to Vss at an access Vss voltage level 482 of 0V. A retention voltage differential 442 between Vdd and Vss of 0.6V is accomplished by raising Vss to a Vss retention voltage level 484 of 0.2V, saving 0.2V of voltage differential. In some usage scenarios the voltage savings is sufficient to decrease static power consumption by decreasing leakage current associated with the RAM array receiving the reduced voltage differential. In some embodiments, it is more desirable to change the voltage differential by altering Vdd rather than by altering Vss. Of course, the voltage levels applied to Vss and Vdd in the access and retention states as illustrated are representative of one embodiment, and the voltage levels used in a given embodiment will be influenced by factors such as but not limited to: manufacturing process type; manufacturing process corner; ambient temperature; power distribution circuitry and design, and wiring in the cache memory; and the way in which SPC 732 operates. The voltages levels used in a given embodiment are fixed, or alternatively are dynamically adjusted based on a number of factors such as, but not limited to: total power consumption; a desired speed of operation or performance; and the ambient temperature.

As illustrated in FIG. 4C with reference to the clock cycles in FIG. 4B, the sequence of operations for current operation 492 to access one or more desired sectors in the reduced-power cache memory is pipelined over three clock cycles 420, 422, and 424. Note that in the figure, "Scts" is used throughout to represent sectors. Prior to commencing the operations, the one or more desired sectors in the reduced-power cache memory are retaining state and are not accessible, as illustrated for current operation 492 in clock cycle 418, and as assumed for clock cycles prior to that and subsequent to a previous access operation. The number of clock cycles (three) illustrated for the access operation is a representative one of many possible embodiments, and the operations described with respect to this figure take more or fewer clock cycles, or even a variable number of clock cycles, in other possible embodiments. In still other embodiments, such as those using asynchronous logic techniques, the time durations of operations are not related to clock cycles, but are either fixed durations, or are bounded by occurrences of other events in the circuitry. The factors affecting how long the various operations take include: design and attributes of the sector power control; the manufacturing type; the manufacturing process corner; the design of the power distribution circuitry and wiring in the cache memory; and the ambient temperature.

Continuing with FIG. 4C, the possible pipelining of multiple parallel operations to the same reduced-power cache memory is demonstrated by older operation 490, started one cycle before current operation 492, and newer operation 494, starting one cycle after current operation 492. In the illustrated pipelined embodiment, functions performed when current operation 492 is in clock cycle 420 are performed by older operation 490 (started one cycle earlier than current operation 492) in clock cycle 418. Similarly, functions performed when current operation 492 is in clock cycle 420 are performed by newer operation 494 (started one cycle after current operation 492) in clock cycle 422. Accordingly, various elements of the data sectors in the reduced-power cache memory are, in various usage scenarios, in different states among powering-up, being accessed, and powering-down at any one time. In some usage scenarios, one or more pipelined operations affect a same sector, and in some embodiments the operations for the same sector are prioritized. For example, if a particular sector is related to an older operation and concurrently to either a current operation or a newer operation, then the particular sector is not powered-down, as would otherwise occur for the older operation. Also see the description relating to "Command for Same Sector(s)?" 512 of FIG. 5.

Vss voltage waveform 486 illustrated in FIG. 4A is with respect to the access of one or more desired sectors with respect to current operation 492. Other similar sequences (such as older operation 490 and newer operation 494) are optionally in progress concurrently. Furthermore, the other sequences are, in some usage scenarios, to other data sectors, and the respective Vss voltage waveforms appear similar to the illustrated Vss voltage waveform, though shifted in time.

With reference to current operation 492 and Vss voltage waveform 486, prior to clock cycle 420 (such as in clock cycle 418) the data sector(s) of interest are in a reduced-power state where the voltage differential applied is equal to retention voltage differential 442. The retention voltage differential is sufficient to maintain state, but is not sufficient to support access to the rows in the data sector(s) of interest. In clock cycle 420, an address applied to the reduced-power cache memory is used to start an access to the tag portion. At proximately the same time, via power-sequencing logic such as SPC 732 in FIG. 2, the address is decoded and used to select one or more sectors to which power will be applied. Power is then applied by increasing the voltage differential supplied to the one or more sectors from retention voltage differential 442 to access voltage differential 446. In clock cycle 422, the access voltage differential has been achieved, and the desired rows, in the one or more sectors that have just been powered up, are accessed. In clock cycle 424, the access has been completed, and the voltage supplied to the one or more desired sectors is reduced from access voltage differential 446 back to retention voltage differential 442. Current operation 492 is thus completed. The changes in the voltage differential, accomplished in this embodiment by changing Vss, are illustrated by Vss voltage waveform 486. The waveform is merely illustrative, as the exact shape of the waveform during the voltage differential changes, and how flat it is during the access itself is affected by various factors such as: precisely how SPC 732 turns power up and down to the desired sector(s), the power supplies, power distribution circuitry, amount and location of any capacitive bypassing, and the manufacturing process type.

Reduced-Power RAM Control Techniques

Figure 5:
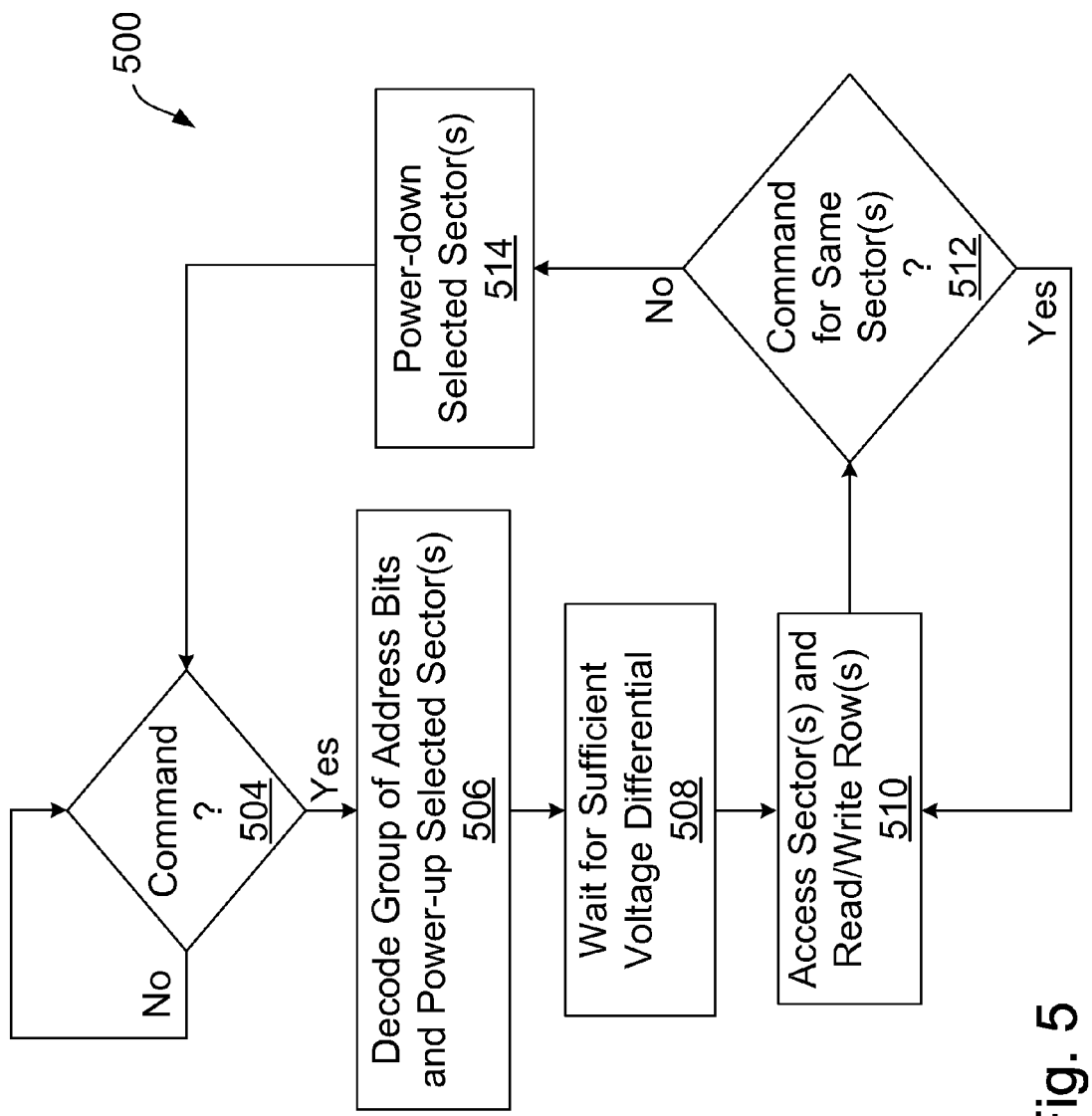
FIG. 5 illustrates a flowchart of an embodiment of the invention as a technique to control the voltage to and access of a reduced-power cache memory.

FIG. 5 illustrates flowchart 500 of an embodiment of the invention as a technique to control the voltage to and access of a reduced-power cache memory (such as reduced-power cache memory 711A of FIG. 1A). Similar to FIG. 4, the figure is with respect to operation of one or a related set of sectors, such as a sector group, in the reduced-power cache memory. In pipelined or otherwise overlapped embodiments, different sectors or different sector groups are in the various stages of the flowchart at the same time. For example, an operation is initiated to one sector causing the one sector to be powered up, while at the same time an older operation is accessing data from an already-powered-up sector, while at the same time a third sector, having completed an operation, is being powered down. In some embodiments, sectors which are not in the process of being powered-up, accessed, or powered-down are in a reduced-power state. The reduced power state is sufficient for the sectors to retain state, but not to be accessed.

Continuing with FIG. 5, the reduced-power cache memory awaits an arrival of a command in decision box 504. If no command to the reduced-power cache memory has been received, then flow returns to decision box 504. When the reduced-power cache memory receives a command, such as a read or a write command, decision box 504 transitions to "Decode Group of Address Bits and Power-up Selected Sector(s)" 506 where the address received with the command is decoded to determine which sector(s) are to be powered up. Operation continues with "Wait for Sufficient Voltage Differential" 508, which waits for a sufficient voltage differential to permit access to the desired sector(s). In some embodiments, the waiting takes the form of a fixed time delay either as an absolute time or as one or more clock cycles, while in other embodiments the delay is a variable delay having duration determined by measurement of the voltage differential. When sufficient time has elapsed and the required voltage differential for access is obtained, operation proceeds to "Access Sector(s) and Read/Write Row(s)" 510 where the received command is performed on the desired sector(s). Since the desired sector(s) are already powered-up, in some usage scenarios it is advantageous to determine if there is another command for the same sector(s). This is accomplished by decision box "Command for Same Sector(s)?" 512. In some embodiments, if a command is immediately available for the same sector(s), then flow continues back to "Access Sector(s) and Read/Write Row(s)" 510. In some embodiments, if a command is about to be available for the same sector(s), then flow continues back to "Access Sector(s) and Read/Write Row(s)" 510 after a delay to wait for the command. If a command is not available, then flow proceeds to "Power-down Selected Sector(s)" 514 where the desired sector(s) are directed to the reduced-power state to reduce static power. Finally, flow returns to decision box 504 awaiting another command. As described with respect to "Command?" 504, the desired sector(s) then remain in the reduced-power state until a subsequent command is received.

The flowchart in FIG. 5 is only one of many possible embodiments of the control and sequencing of power to the rows of the data portion of the reduced-power cache memory. Many other embodiments are possible, and are contemplated.

Example Hardware Embodiment Techniques

In some embodiments, various combinations of all or portions of functions performed by CPU 710, reduced-power cache memory 711A, reduced-power L2 cache memory 711B, reduced-power L3 cache memory 711C, GRD 210, SRDs 212, SPC 732; and hardware implementing various aspects of processing associated with FIG. 4C and FIG. 5; and portions of a processor or a microprocessor providing all or portions of the aforementioned functions, are specified compatibly with processing by a computer system. In various embodiments the processing comprises any combination of interpretation, compilation, simulation, and synthesis to produce, to verify, or to specify logic and/or circuitry suitable for inclusion on one or more integrated circuits.

Various embodiments of the invention are specified using various descriptions, such as hardware description languages, circuit descriptions, netlist descriptions, mask descriptions, or layout descriptions. Example descriptions include: Verilog, VHSIC Hardware Description Language (VHDL), Simulation Program with Integrated Circuit Emphasis (SPICE), SPICE variants such as PSpice, Input/output Buffer Information Specification (IBIS), Library Exchange Format (LEF), Design Exchange Format (DEF), Graphic Design System II (GDS-II), Open Artwork System Interchange Standard (OASIS), or other descriptions. As known by one skilled in the art, the processing of such a description of an embodiment of this invention generates a representation of that embodiment. Such a representation is then used by one or more computer-based design tools for one or more of a variety of purposes, such as: design capture; design documentation; register-level simulation; logic-level simulation; circuit simulation; mixed-level simulation; logic synthesis, circuit synthesis, layout synthesis, test synthesis, design verification; and transfer to integrated circuit (IC) manufacturing (also known as tapeout).

The integrated circuits, according to various embodiments, are designed, instantiated, manufactured, or any combination thereof according to a variety of techniques. The techniques comprise a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with designing, instantiating, manufacturing, or any combination thereof of integrated circuits.

Example Embodiments

In some embodiments, a reduced-power memory comprises: an address-specific component divided into a plurality of sectors, each sector containing a plurality of memory rows (columns); a word-line decoding circuit responsive to a plurality of memory address bits coupled to the address-specific component to select one of the memory rows (columns) as a target of an access; and a power-sequencing unit responsive to a first group of the memory address bits. The power-sequencing unit is enabled to power-up a selected one of the sectors as determined by the first group of the memory address bits to enable the memory to perform the access The first group of the memory address bits is provided to the memory prior to a second group of the memory address bits being provided to the memory.

In some embodiments, a method for controlling access to a reduced-power memory comprises: in response to a first group of a plurality of memory address bits, powering-up a selected sector of a plurality of sectors in an address-specific component of the memory; and in response to the first group and a second group of the memory address bits, selecting one of a plurality of rows (columns) from within the selected sector as a target of an access. The first group is available before the second group. In some embodiments, the powering-up is via a power-sequencing unit included in the memory. In some embodiments, the row (column) selecting is via a word-line decoding circuit included in the memory.

In some embodiments, the powering-up is via lowering ground supplied to the selected sector from a retention voltage to an access voltage. In some embodiments, the powering-up is via switching ground supplied to the selected sector from a retention voltage to an access voltage. In some embodiments, the access voltage is a lower level than the retention voltage.

In some embodiments, the power-sequencing unit is further enabled to power-down the selected sector. In some embodiments, the powering-down is via raising ground supplied to the selected sector from an access voltage to a retention voltage.

In some embodiments, the powering-up is via raising power supplied to the selected sector from a retention voltage level to an access voltage level. In some embodiments, the powering-up is via switching power supplied to the selected sector from a retention voltage level to an access voltage level. In some embodiments, the access voltage level is a higher level than the retention voltage level.

In some embodiments, the power-sequencing unit is further enabled to power-down the selected sector and the powering-down is via switching the power supplied to the selected sector from the access voltage level to the retention voltage level.

In some embodiments, a reduced-power memory comprises: an address-specific component divided into at least one sector, each sector containing at least one memory row (column); a word-line decoding circuit responsive to a plurality of memory address bits coupled to the address-specific component to select one of the memory rows (columns) as a target of an access; and a power-sequencing unit responsive to a group of the memory address bits. The power-sequencing unit is enabled to power-up a selected one of the sectors as determined by the group of the memory address bits to enable the memory to perform the access. The powering-up is via lowering ground supplied to the selected sector from a retention voltage value to an access voltage value. In some embodiments, another group of the address bits is provided to the memory subsequent to the group of address bits being applied to the memory.

In some embodiments, a reduced-power memory comprises: an address-specific component divided into a plurality of sectors, each sector containing a plurality of memory rows; a word-line decoding circuit responsive to a plurality of memory address bits coupled to the address-specific component to select one of the memory rows as a target of an access; and a power-sequencing unit responsive to a group of the memory address bits. The power-sequencing unit is enabled to power-up a selected one of the sectors as determined by the group of the memory address bits to enable the memory to perform the access. The powering-up is via raising power supplied to the selected sector from a retention voltage level to an access voltage level. In some embodiments, the group of address bits is a first group of the address bits and a second group of the address bits is provided to the memory subsequent to the first group being provided to the memory.

In some embodiments, a method for controlling access to a reduced-power memory comprises: in response to a first group of a plurality of memory address bits, powering-up a selected sector of a plurality of sectors in an address-specific component of the memory; and in response to the first group and a second group of the memory address bits, selecting one of a plurality of rows (columns) from within the selected sector as a target of an access. The powering-up is via lowering ground supplied to the selected sector from a retention voltage to an access voltage. In some embodiments, the first group is available before the second group.

In some embodiments, a method for controlling access to a reduced-power memory comprises: in response to a first group of a plurality of memory address bits, powering-up a selected sector of a plurality of sectors in an address-specific component of the memory; and in response to the first group and a second group of the memory address bits, selecting one of a plurality of rows (columns) from within the selected sector as a target of an access. The powering-up is via raising Vdd supplied to the selected sector from a retention voltage value to an access voltage value. In some embodiments, the first group is available before the second group.

In some embodiments, the power-sequencing unit is enabled to apply a different amount of power to the selected sector for a read command compared to a write command. In some embodiments, the powering-up is according to one of a plurality of power-up conditions in response to a respective one of a plurality of commands. In some embodiments, the commands include at least one of a read command, a write command, and a clear command.

In some embodiments, the power-sequencing unit is enabled to apply a different ground voltage value to the selected sector for a read command compared to a write command. In some embodiments, the power-sequencing unit is enabled to apply a different power voltage value to the selected sector for a read command compared to a write command.

In some embodiments, the powering-up is via gating one of at least two distinct voltages onto a power rail. In some embodiments, the powering-up is via gating one of at least two distinct voltages onto a ground rail.

In some embodiments, the memory is implemented as a plurality of banks and the power-sequencing unit is further enabled to power-up respective portions of the banks in parallel. In some embodiments, one of the rows (columns) spans the banks.

In some embodiments, the memory is a data portion of a cache memory. In some embodiments, one of the rows (columns) implements a plurality of lines of the cache memory. In some embodiments, the one of the rows (columns) is determined in part by a column (row) multiplexing factor. In some embodiments, the number of lines in the one of the rows (columns) is determined in part by a column (row) multiplexing factor multiplied by a count of the banks.

In some embodiments, the memory is a data portion of a cache memory, and the cache memory implements a plurality of ways as a set-associative, multi-way cache. In some embodiments, each of the rows (columns) implements at least one respective line from at least one of the ways.

In some embodiments, the word-line decoding circuit includes a per-sector portion. The per-sector portion includes a respective per-sector word-line decoding circuit for each of the sectors. The per-sector word-line decoding circuits determine the selected row (column) based upon a portion of the memory address bits that is distinct from the memory address bits the power-sequencing unit is responsive to. In some embodiments, the power-sequencing unit is further enabled to power-up the respective per-sector word-line decoding circuit corresponding to the selected sector when the selected sector is powered-up. In some embodiments, the power-sequencing unit is further enabled to power-down the selected sector in response to completion of the access. In some embodiments, the power-sequencing unit is further enabled to power-off the respective per-sector word-line decoding circuit corresponding to the selected sector when the selected sector is powered-down.

In some embodiments, the word-line decoding circuit further includes a global portion.

In some embodiments, respective ones of the per-sector word-line decoding circuits are powered-off when the corresponding sectors are not being accessed.

In some embodiments, the power-sequencing unit is further enabled to power-down the selected sector subsequent to the access.

In some embodiments, the power-sequencing unit is further enabled to continuously power-up the selected sector for a subsequent access if the subsequent access is provided before the selected sector is powered-down.

In some embodiments, the memory is a data portion included in a cache memory, and the cache memory further includes a tag portion. In some embodiments, a third group of a second plurality of memory address bits is used to access the tag portion, and a fourth group of the second plurality of memory address bits is used to validate the access by comparison with results of the access to the tag portion. In some embodiments, the validation of the access includes choosing one of a plurality of ways provided by the selected sector. In some embodiments, the choosing is in response to a way selector provided by the validation. In some embodiments, the choosing is further in response to a fifth group of the second plurality of memory address bits. In some embodiments, the choosing includes picking one of a plurality of lines provided by the selected row (column) in the selected sector.

In some embodiments, a system comprises: a processor; and a cache having a reduced-power memory. The processor is enabled to access the cache. In some embodiments, the processor is a first processor and the system further includes a second processor enabled to access the cache In some embodiments, the cache is a first cache, the reduced-power memory is a first reduced-power memory and the system further comprises a second cache having a second reduced-power memory. In some embodiments, the processors are enabled to access the second cache. In some embodiments, the caches are at an identical level of a cache hierarchy. In some embodiments, the caches are at distinct levels of a cache hierarchy.

In some embodiments, a system comprises: a processor; and a buffer having a reduced-power memory. The processor is enabled to access the buffer. In some embodiments, the buffer is at least one of a graphics buffer, an input/output buffer, and a direct-memory-access buffer.

In some embodiments, a system comprises: a power-sequencing unit responsive to a group of address bits; and a plurality of storage sectors coupled to the power-sequencing unit. The power-sequencing unit is enabled to power-up a selected one of the storage sectors based at least in part on the group of address bits. The power-up is via altering ground supplied to the selected sector from a retention level to an access level.

CONCLUSION

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description and are within the scope of the claims of the issued patent. For example, interconnect and function-unit bit-widths, clock speeds, and the type of technology used are variable according to various embodiments in each component block. Names given to interconnect and logic are merely descriptive, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications, are merely those of the described embodiments, are expected to track improvements and changes in implementation technology, and should not be construed as limitations.

Functionally equivalent techniques known in the art are employable instead of those described to embody various components, sub-systems, functions, operations, routines, and sub-routines. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards; such as the organization and structure of the cache memory; whether the cache memory is virtually or physically addressed, or some combination thereof; in which level or levels of the memory hierarchy the cache memory is used; the latency of power-up or power-down of the sectors of the cache memory and its access time; the number of clock cycles or the amount of time to carry out parts of the necessary operations; the number of entries or stages in registers and buffers; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or elements without altering basic cooperation among the remaining elements. It is thus understood that much of the details described are not required to implement various aspects of the embodiments described. To the extent that the remaining elements are distinguishable from the prior art, components and features that are omitted are not limiting on the embodiments described herein.

Certain choices have been made in the description merely for convenience in preparing the text and drawings and unless there is an indication to the contrary the choices should not be construed per se as conveying additional information regarding structure or operation of the embodiments illustrated. Illustrative examples of the choices of convenience include: the particular organization or assignment of the designations used for the figure numbering and the particular organization or assignment of the element identifiers (i.e., the callouts or numerical designators) used to identify and reference the features and elements of the embodiments.

All such variations in embodiments comprise insubstantial changes over the teachings conveyed by the described embodiments. It is also understood that the embodiments described herein have broad applicability to other computing applications, and are not limited to the particular application or industry of the described embodiments. The invention is thus to be construed as including all possible modifications and variations encompassed within the scope of the claims of the issued patent.

The invention claimed is:

1. A method for reducing power consumption of a volatile memory implemented within one or more integrated circuits, the volatile memory comprising a plurality of sectors, and each sector comprising one or more sub-sectors, the method comprising:
   receiving a first portion of an address within the volatile memory from a processor, the processor implemented within the integrated circuits;
   in response to the first portion, powering-up a selected one of the sectors;
   after receiving the first portion, receiving a second portion of the volatile memory address from the processor;
   in response to the first and the second portions, selecting one of the sub-sectors from within the selected sector; and
   accessing at least a portion of the volatile memory within the selected sub-sector.

2. The method of claim 1, wherein the powering-up is via changing a ground voltage supplied to the selected sector from a retention voltage to an access voltage.

3. The method of claim 2, wherein the access voltage is a first value when the accessing is reading and a second value when the accessing is writing.

4. The method of claim 1, wherein the powering-up is via raising voltage on a power bus supplied to the selected sector from a retention voltage to an access voltage.

5. The method of claim 1, further comprising in response to completing the accessing, powering-down the selected sector.

6. A storage circuit adapted for use with a processor comprising:
   an address interface circuit adapted to receive a first portion of an address and then to receive, a second portion of the address;
   a storage array circuit comprising a plurality of sectors, each sector comprising one or more sub-sectors, each sub-sector comprising a plurality of volatile data storage cell circuits, and each volatile data storage cell circuit being enabled to retain information when not powered-up and further enabled to provide access to the information when powered-up, and configured to consume less power when not-powered up than when powered-up;
   a power-sequencing circuit enabled to power-up a selected one of the sectors prior to an access as determined based at least in part on the first portion;
   a sub-sector decoding circuit enabled to select one of the sub-sectors of the selected sector as determined based at least in part on the second portion; and
   wherein the storage circuit and the processor are implemented within one or more integrated circuits.

7. The storage circuit of claim 6, wherein each sector corresponds to respective groups of one or more rows of the storage array circuit.

8. The storage circuit of claim 6, wherein each sector corresponds to respective groups of one or more columns of the storage array circuit.

9. The storage circuit of claim 6, wherein the power-up is via gating one of two or more distinct voltage values onto one or more distinct ground rails of the storage array circuit.

10. The storage circuit of claim 6, wherein the power-up is via lowering ground supplied to the selected sector from a retention voltage to an access voltage.

11. The storage circuit of claim 6, wherein the power-sequencing circuit is further enabled to power-down the selected sector subsequent to completion of the access.

12. The storage circuit of claim 11, wherein the power-down is via raising a ground voltage supplied to the selected sector from an access voltage to a retention voltage.

13. The storage circuit of claim 6, wherein the power-sequencing circuit is further enabled to continuously keep the selected sector powered-up for a subsequent access if the subsequent access is provided before the selected sector is powered-down.

14. The storage circuit of claim 6, wherein the storage array circuit is organized in banks and the power-sequencing circuit is further enabled to power-up respective portions of the banks in parallel.

15. The storage circuit of claim 14, wherein one or more of the sub-sectors spans the banks.

16. The storage circuit of claim 6, wherein the address interface circuit, the storage array circuit, the power-sequencing circuit, and the sub-sector decoding circuit are enabled to operate as a memory accessible by the processor.

17. The storage circuit of claim 6, wherein the address interface circuit, the storage array circuit, the power-sequencing circuit, and the sub-sector decoding circuit are enabled to operate as a graphics buffer accessible by the processor.

18. The storage circuit of claim 6, wherein the address interface circuit, the storage array circuit, the power-sequencing circuit, and the sub-sector decoding circuit are enabled to operate as a cache accessible by the processor.

19. The storage circuit of claim 18, wherein the cache is accessible by the processor as a set-associative multi-way cache, and each sub-sector is enabled to provide one or more respective lines of each way.

20. The storage circuit of claim 19, wherein the sub-sectors correspond to rows/columns and the number of the lines provided by each row/column is based at least in part on a column/row multiplexing factor.

21. The storage circuit of claim 6, wherein:
   the sub-sector decoding circuit comprises a per-sector portion;
   the per-sector portion comprises a respective per-sector driving circuit corresponding to each sector; and
   the per-sector driving circuits determine the selected sub-sector based at least in part on a third portion of the address that is distinct from the first portion.

22. The storage circuit of claim 21, wherein the power-sequencing circuit is further enabled to power-up the per-sector driving circuit corresponding to the selected sector when the selected sector is powered up.

23. The storage circuit of claim 21, wherein the power-sequencing circuit is further enabled to power-off the per-sector driving circuit corresponding to the selected sector when the selected sector is powered down.

24. A storage circuit adapted for use with a processor comprising:
- means for receiving an address, the address comprised of first and second portions, the means for receiving enabled to receive the first portion before the second portion;
- means for volatile data storage arranged as sectors, each sector comprising one or more sub-sectors;
- means for powering-up a selected one of the sectors prior to an access as determined based at least in part on the first portion;
- means for selecting one of the sub-sectors of the selected sector as determined based at least in part on the second portion; and
- wherein power consumption of the selected sector is less when not powered-up than when powered up, and the processor, the means for receiving, the means for volatile data storage, the means for powering-up, and the means for selecting are implemented within one or more integrated circuits.

25. The storage circuit of claim 24, further comprising means for powering-down the selected sector subsequent to completion of the access.

26. A medium readable by a computer system that contains a description that generates, when processed by the computer system, a representation of a circuit comprising:
- an address reception control sub-circuit adapted to interface with a processor to control reception of a first portion of an address followed by a second portion of the address;
- a power-sequencing sub-circuit enabled to select one of a plurality of sectors of a storage array based at least in part on the first portion, and to direct powering-up of the selected sector prior to an access thereof;
- a sub-sector decoding control sub-circuit enabled to direct operation of a sub-sector decoder circuit to select one of a plurality of sub-sectors of the selected sector as determined based at least in part on the second portion; and
- wherein the selected sector is configured to consume less power when not powered-up than when powered-up.

27. The medium of claim 26, wherein the power-sequencing sub-circuit is further enabled to direct powering-down of the selected sector subsequent to completion of the access.

28. The medium of claim 26, wherein the power-sequencing sub-circuit is further enabled to direct continuously keeping the selected sector powered-up for a subsequent access if the subsequent access is provided before the selected sector is powered-down.

* * * * *